(12) United States Patent
Shikauchi et al.

(10) Patent No.: US 10,158,013 B1
(45) Date of Patent: Dec. 18, 2018

(54) SEMICONDUCTOR DEVICE AND METHOD FOR MANUFACTURING THE SEMICONDUCTOR DEVICE

(71) Applicant: Sanken Electric Co., Ltd., Saitama (JP)

(72) Inventors: Hiroshi Shikauchi, Saitama (JP); Satoru Washiya, Saitama (JP); Youhei Ohno, Saitama (JP); Tomonori Hotate, Saitama (JP); Hiromichi Kumakura, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 15/610,665

(22) Filed: Jun. 1, 2017

(51) Int. Cl.
| | |
|---|---|
| *H01L 51/00* | (2006.01) |
| *H01L 51/52* | (2006.01) |
| *H01L 29/78* | (2006.01) |
| *H01L 29/16* | (2006.01) |
| *H01L 29/24* | (2006.01) |
| *H01L 29/66* | (2006.01) |

(52) U.S. Cl.
CPC ...... *H01L 29/7823* (2013.01); *H01L 29/1608* (2013.01); *H01L 29/24* (2013.01); *H01L 29/66681* (2013.01)

(58) Field of Classification Search
CPC ............. H01L 21/046; H01L 21/02529; H01L 21/02378; H01L 21/265; H01L 21/8213; H01L 29/1608; H01L 29/1095; H01L 29/7802; H01L 29/36; H01L 29/205; H01L 29/7811; H01L 29/0615; H01L 23/5329; H01L 29/0623; H01L 29/0634; H01L 29/41766; H01L 29/4238; H01L 29/517; H01L 27/0617; H01L 27/0664; H91L 21/02529

See application file for complete search history.

(56) References Cited

U.S. PATENT DOCUMENTS

| | | | |
|---|---|---|---|
| 9,620,611 B1 * | 4/2017 | Clifton | ............... H01L 29/4966 |
| 2012/0280270 A1 * | 11/2012 | Ryu | ................... H01L 29/0696 257/133 |
| 2015/0187871 A1 | 7/2015 | Schulze et al. | |
| 2018/0097103 A1 * | 4/2018 | Sadamatsu | .......... H01L 29/7815 |

OTHER PUBLICATIONS

Hara et al "Pinning-controlled ohmic contacts: application to SiC(0001)", Applied Surface Science, 107 (1996) pp. 218-221.*

* cited by examiner

*Primary Examiner* — Caridad Everhart
(74) *Attorney, Agent, or Firm* — Harness, Dickey & Pierce, P.L.C.

(57) ABSTRACT

A semiconductor device and a method for manufacturing the semiconductor device. The semiconductor device includes a silicon carbide drift layer, a buried silicon carbide layer and an oxide semiconductor layer; the buried silicon carbide layer is located within the silicon carbide drift layer and the buried silicon carbide layer is covered by the oxide semiconductor layer. Therefore, breakdown behavior and/or long-time reliability of the semiconductor device may be further improved.

18 Claims, 6 Drawing Sheets

SEMICONDUCTOR DEVICE AND METHOD FOR MANUFACTURING THE SEMICONDUCTOR DEVICE

TECHNICAL FIELD

Embodiments of the present disclosure generally relate to the field of semiconductors, and more particularly, to a semiconductor device and a method for manufacturing the semiconductor device.

BACKGROUND

A semiconductor device may include a silicon carbide (SiC) drift layer (also may be referred to as an epitaxial silicon carbide layer, and so on), and the silicon carbide drift layer may have (or be with, comprise, include, and so on) a first conductivity type, such as N type (or may be referred to as n-doping).

Moreover, the semiconductor device may include a buried silicon carbide layer (also may be referred to as an edge termination region, and so on), and the buried silicon carbide layer is located within the silicon carbide drift layer. The buried silicon carbide layer may have (or be with, comprise, include, and so on) a second conductivity type, such as P type (or may be referred to as p-doping).

In some scenarios, the buried silicon carbide layer may be covered by a silicon carbide surface layer. For example, an upper surface of the buried silicon carbide layer is covered by the silicon carbide surface layer and other surfaces (such as a lower surface and four side surfaces) of the buried silicon carbide layer are located within the silicon carbide drift layer.

Therefore, electric field in an operating state is reduced toward edge of the semiconductor device, due to the buried silicon carbide layer. Furthermore, an oxidation of the buried silicon carbide layer may be avoided by covering with the silicon carbide surface layer. In this way, breakdown behavior and/or long-time reliability of the semiconductor device may be improved.

This section introduces aspects that may facilitate a better understanding of the disclosure. Accordingly, the statements of this section are to be read in this light and are not to be understood as admissions about what is in the prior art or what is not in the prior art.

SUMMARY

However, the inventor found that a band gap of the silicon carbide surface layer is small, for example, is smaller than that of a protective layer (or may be an interlayer insulating film). The protective layer may include such as silicon oxide ($S_iO_2$), and/or silicon nitride ($S_iN$) and/or silicon oxide nitride ($S_iON$). For example, the band gap of the silicon carbide surface layer (such as 4H—SiC) may be 3.26 eV.

Therefore, dielectric breakdown electric field of the silicon carbide surface layer is small and may not suffer from an electric filed with a high value. It is expected to further improve the breakdown behavior and/or long-time reliability of the semiconductor device.

In order to solve at least part of the above problems, methods, apparatus, devices are provided in the present disclosure. Features and advantages of embodiments of the present disclosure will also be understood from the following description of specific embodiments when read in conjunction with the accompanying drawings, which illustrate, by way of example, the principles of embodiments of the present disclosure.

In general, embodiments of the present disclosure provide a semiconductor device and a method for manufacturing the semiconductor device.

In a first aspect, a semiconductor device is provided. The semiconductor device includes a silicon carbide drift layer having a first conductivity type, a buried silicon carbide layer having a second conductivity type and an oxide semiconductor layer having the first conductivity type. The buried silicon carbide layer is located within the silicon carbide drift layer and the buried silicon carbide layer is covered by the oxide semiconductor layer.

In one embodiment, a band gap of the oxide semiconductor layer is larger than a band gap of a silicon carbide layer.

In one embodiment, the oxide semiconductor layer includes zinc oxide and/or stannic oxide.

In one embodiment, the first conductivity type is an n-doping and the second conductivity type is a p-doping.

In one embodiment, the semiconductor device further includes a protective layer configured on the oxide semiconductor layer.

In one embodiment, a first surface of the oxide semiconductor layer is contacted with the protective layer and a second surface of the oxide semiconductor layer is contacted with the buried silicon carbide layer.

In one embodiment, the protective layer includes silicon oxide and/or silicon nitride and/or silicon oxide nitride.

In one embodiment, the semiconductor device further includes an electrode configured on the silicon carbide drift layer.

In one embodiment, the electrode is not contacted with the oxide semiconductor layer.

In one embodiment, a protective layer is configured between the electrode and the oxide semiconductor layer.

In one embodiment, a gap is configured between the electrode and the oxide semiconductor layer.

In one embodiment, the electrode is contacted with the buried silicon carbide layer.

In one embodiment, the protective layer is covered on the oxide semiconductor layer.

In one embodiment, the semiconductor device further includes a silicon carbide substrate having the first conductivity type. The silicon carbide drift layer is configured on the silicon carbide substrate.

In a second aspect, a method for manufacturing a semiconductor device is provided. The method includes providing a silicon carbide drift layer having a first conductivity type, providing a buried silicon carbide layer having a second conductivity type and providing an oxide semiconductor layer having the first conductivity type. The buried silicon carbide layer is located within the silicon carbide drift layer and the buried silicon carbide layer is covered by the oxide semiconductor layer.

In one embodiment, the method further includes providing a protective layer configured on the oxide semiconductor layer.

In one embodiment, the method further includes providing an electrode configured on the silicon carbide drift layer.

In one embodiment, the method further includes providing a silicon carbide substrate having the first conductivity type. The silicon carbide drift layer is configured on the silicon carbide substrate.

According to various embodiments of the present disclosure, a buried silicon carbide layer is located within a silicon carbide drift layer and the buried silicon carbide layer is covered by an oxide semiconductor layer. Therefore, a band gap of the oxide semiconductor layer is large and breakdown behavior and/or long-time reliability of the semiconductor device may be further improved.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

The present disclosure will now be described with reference to several example embodiments. It should be understood that these embodiments are discussed only for the purpose of enabling those skilled persons in the art to better understand and thus implement the present disclosure, rather than suggesting any limitations on the scope of the present disclosure.

It should be understood that when an element is referred to as being "connected" or "coupled" or "contacted" to another element, it may be directly connected or coupled or contacted to the other element or intervening elements may be present. In contrast, when an element is referred to as being "directly connected" or "directly coupled" or "directly contacted" to another element, there are no intervening elements present. Other words used to describe the relationship between elements should be interpreted in a like fashion (e.g., "between" versus "directly between", "adjacent" versus "directly adjacent", etc.).

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof.

The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

A First Aspect of Embodiments

A semiconductor device is provided in those embodiments.

Figure 1:
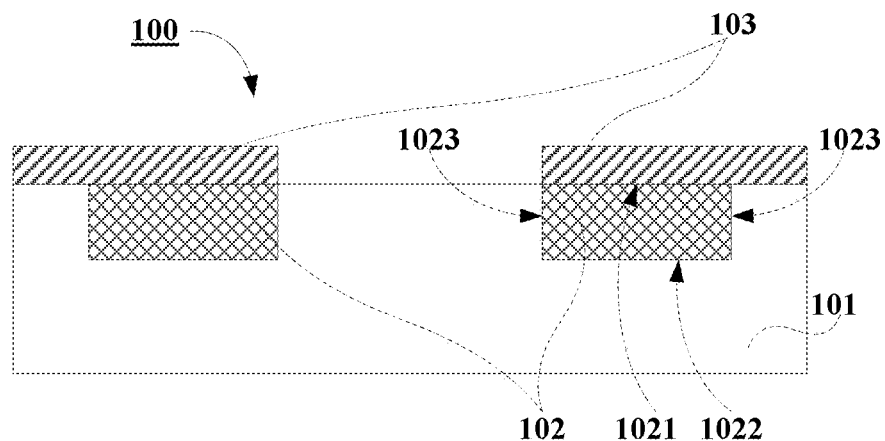
FIG. 1 is a diagram which shows a schematic illustration of a cross-section of a semiconductor device 100 in accordance with an embodiment of the present disclosure.

FIG. 1 is a diagram which shows a schematic illustration of a cross-section of a semiconductor device 100 in accordance with an embodiment of the present disclosure. As shown in FIG. 1, the semiconductor device 100 includes a silicon carbide drift layer 101 having a first conductivity type; a buried silicon carbide layer 102 having a second conductivity type and an oxide semiconductor layer 103 having the first conductivity type.

As shown in FIG. 1, the buried silicon carbide layer 102 is located within the silicon carbide drift layer 101; the buried silicon carbide layer 102 is covered by the oxide semiconductor layer 103.

In an embodiment, a band gap of the oxide semiconductor layer 103 is larger than a band gap of a silicon carbide layer. For example, the oxide semiconductor layer 103 may comprises zinc oxide ($Z_nO$) and/or stannic oxide ($S_nO_2$).

For example, the band gap of $Z_nO$ is 3.37 eV and the band gap of $S_nO_2$ is 4.2 eV, therefore the band gap of the oxide semiconductor layer 103 is larger than the band gap of the silicon carbide surface layer; so that dielectric breakdown electric field of the oxide semiconductor layer 103 is large and may suffer from an electric filed with a high value. Moreover, the breakdown behavior and/or long-time reliability of the semiconductor device may be further improved.

It should be appreciated that $Z_nO$ and/or $S_nO_2$ are only examples of the oxide semiconductor layer, but it is not limited thereto. For example, other oxide semiconductor layer (the band gap is larger than that of a silicon carbide layer) may also be adopted according to actual scenarios.

In an embodiment, the first conductivity type may be an n-doping (or may be referred to as N-type, e.g., caused by incorporating nitrogen ions, phosphor ions or arsenic ions during an epitaxy process) and the second conductivity type may be a p-doping (or may be referred to as P-type, e.g., caused by incorporating aluminum ions or boron ions during an epitaxy process).

However, it is not limited thereto in this disclosure. For example, the first conductivity type may be a p-doping and the second conductivity type may be an n-doping in some scenarios. For the following embodiments, examples of that the first conductivity type is an n-doping and the second conductivity type is a p-doping may be provided to illustrate the semiconductor device of this disclosure.

As shown in FIG. 1, the buried silicon carbide layer 102 may be covered by the oxide semiconductor layer 103. For example, an upper surface 1021 of the buried silicon carbide layer 102 is covered by the oxide semiconductor layer 103 and other surfaces (such as a lower surface 1022 and four side surfaces 1023) of the buried silicon carbide layer 102 are located within the silicon carbide drift layer 101.

Therefore, electric field in an operating state is reduced toward edge of the semiconductor device, due to the buried silicon carbide layer 102. Furthermore, an oxidation of the buried silicon carbide layer 102 may be avoided or decreased by covering with the oxide semiconductor layer 103. Moreover, dielectric breakdown electric field of the oxide semiconductor layer 103 is large. In this way, breakdown behavior and/or long-time reliability of the semiconductor device may be further improved.

Figure 2:
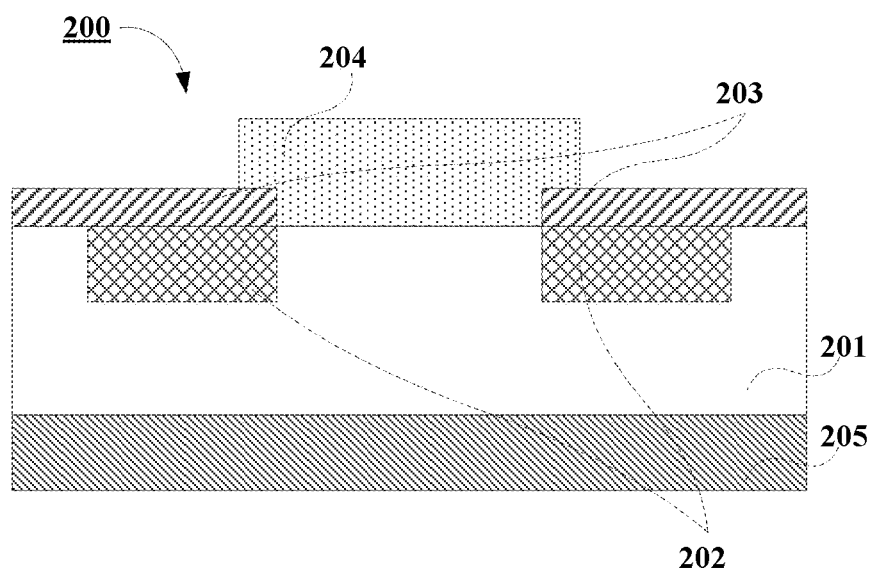
FIG. 2 is a diagram which shows a schematic illustration of a cross-section of a semiconductor device 200 in accordance with an embodiment of the present disclosure.

FIG. 2 is a diagram which shows a schematic illustration of a cross-section of a semiconductor device 200 in accordance with an embodiment of the present disclosure. As shown in FIG. 2, the semiconductor device 200 includes a N-type silicon carbide drift layer 201, a P-type buried silicon carbide layer 202 and a N-type oxide semiconductor layer 203.

As shown in FIG. 2, the P-type buried silicon carbide layer 202 is located within the N-type silicon carbide drift layer 201 and the P-type buried silicon carbide layer 202 is covered by the N-type oxide semiconductor layer 203.

As shown in FIG. 2, the semiconductor device 200 may further include an electrode 204 configured on the N-type silicon carbide drift layer 201. Alternatively, the semiconductor device 200 may further include a N-type silicon carbide substrate 205; the N-type silicon carbide drift layer 201 is configured on the N-type silicon carbide substrate 205.

In an embodiment, a thickness of the P-type buried silicon carbide layer 202 may be, for example, 200 nm to 5 μm; a thickness of the N-type oxide semiconductor layer 203 may be, for example, 20 nm to 2 μm. The thickness of a layer may be an average thickness.

However, it is not limited thereto in this disclosure, for example, the thickness of a layer may be selected within a wide range and/or may be fit to a desired functionality (e.g., diode, transistor) of the semiconductor device. Moreover, doping concentration of a layer may be determined according to an actual scenario.

In an embodiment, a protective layer may be configured on the oxide semiconductor layer.

Figure 3:
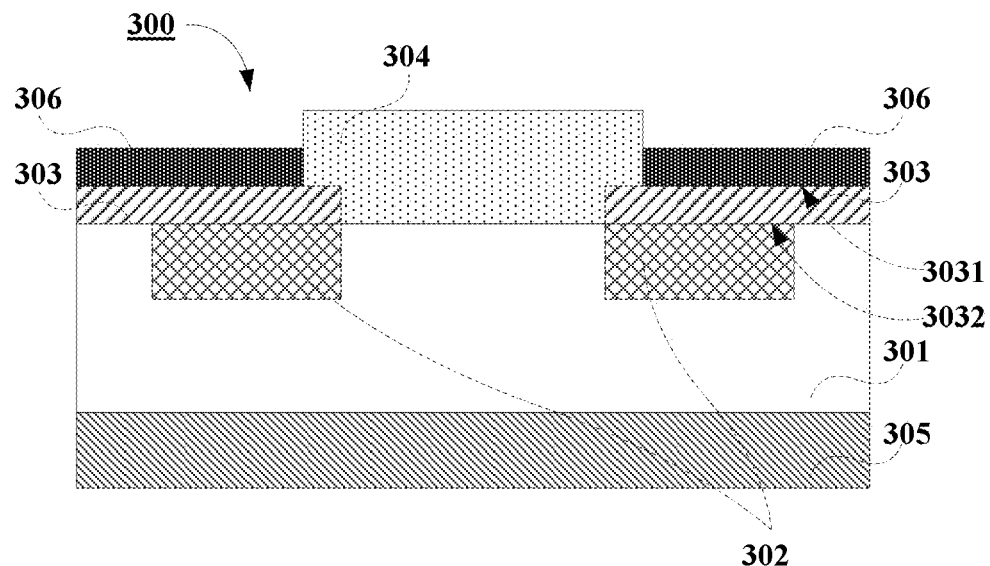
FIG. 3 is a diagram which shows a schematic illustration of a cross-section of a semiconductor device 300 in accordance with an embodiment of the present disclosure.

FIG. 3 is a diagram which shows a schematic illustration of a cross-section of a semiconductor device 300 in accordance with an embodiment of the present disclosure. As shown in FIG. 3, the semiconductor device 300 includes a N-type silicon carbide drift layer 301, a P-type buried silicon carbide layer 302 and a N-type oxide semiconductor layer 303.

As shown in FIG. 3, the P-type buried silicon carbide layer 302 is located within the N-type silicon carbide drift layer 301 and the P-type buried silicon carbide layer 302 is covered by the N-type oxide semiconductor layer 303.

As shown in FIG. 3, the semiconductor device 300 may further include an electrode 304 configured on the N-type silicon carbide drift layer 301. Alternatively, the semiconductor device 300 may further include a N-type silicon carbide substrate 305; the N-type silicon carbide drift layer 301 is configured on the N-type silicon carbide substrate 305.

As shown in FIG. 3, the semiconductor device 300 may further include a protective layer 306 configured on the N-type oxide semiconductor layer 303. For example, a first surface 3031 of the N-type oxide semiconductor layer 303 is contacted with the protective layer 306 and a second surface 3032 of the N-type oxide semiconductor layer 303 is contacted with the P-type buried silicon carbide layer 302.

In an embodiment, the protective layer 306 may also be referred to as an interlayer insulating film. For example, the protective layer 306 may include silicon oxide ($S_iO_2$) and/or silicon nitride ($S_iN$) and/or silicon oxide nitride ($S_iON$). But it is not limited thereto. For example, other protective layer (such as an insulating film) may be adopted according to actual scenarios.

Therefore, degradation (such as an oxidation) of the N-type oxide semiconductor layer 303 may be avoided or decreased by covering with the protective layer 306, stability and/or long-time reliability of the semiconductor device may be further improved.

In an embodiment, the electrode may not be contacted with the oxide semiconductor layer.

Figure 4:
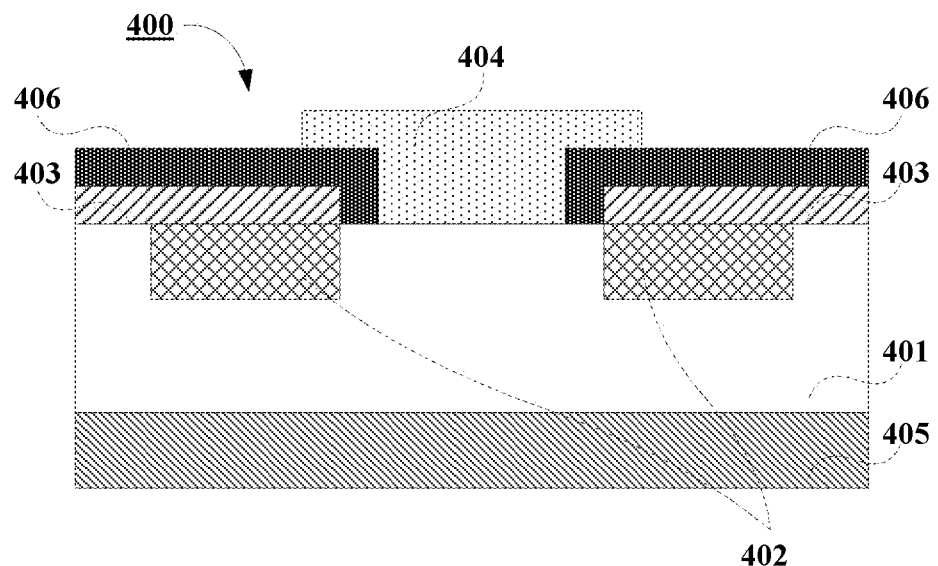
FIG. 4 is a diagram which shows a schematic illustration of a cross-section of a semiconductor device 400 in accordance with an embodiment of the present disclosure.

FIG. 4 is a diagram which shows a schematic illustration of a cross-section of a semiconductor device 400 in accordance with an embodiment of the present disclosure. As shown in FIG. 4, the semiconductor device 400 includes a N-type silicon carbide drift layer 401, a P-type buried silicon carbide layer 402 and a N-type oxide semiconductor layer 403.

As shown in FIG. 4, the P-type buried silicon carbide layer 402 is located within the N-type silicon carbide drift layer 401 and the P-type buried silicon carbide layer 402 is covered by the N-type oxide semiconductor layer 403.

As shown in FIG. 4, the semiconductor device 400 may further include an electrode 404 configured on the N-type silicon carbide drift layer 401. Alternatively, the semiconductor device 400 may further include a N-type silicon carbide substrate 405; the N-type silicon carbide drift layer 401 is configured on the N-type silicon carbide substrate 405.

As shown in FIG. 4, the semiconductor device 400 may further include a protective layer 406 configured on the N-type oxide semiconductor layer 403. Furthermore, the protective layer 406 is configured between the electrode 404 and the N-type oxide semiconductor layer 403, so that the electrode 404 is not contacted with the N-type oxide semiconductor layer 403.

Therefore, an insulating film (i.e., the protective layer 406) is configured between the electrode 404 and the N-type oxide semiconductor layer 403; that is to say, the electrode 404 is insulated from the N-type oxide semiconductor layer 403, due to the protective layer 406. Breakdown may be avoided or decreased when a current is produced in the N-type oxide semiconductor layer 403; stability and/or long-time reliability of the semiconductor device may be further improved.

Figure 5:
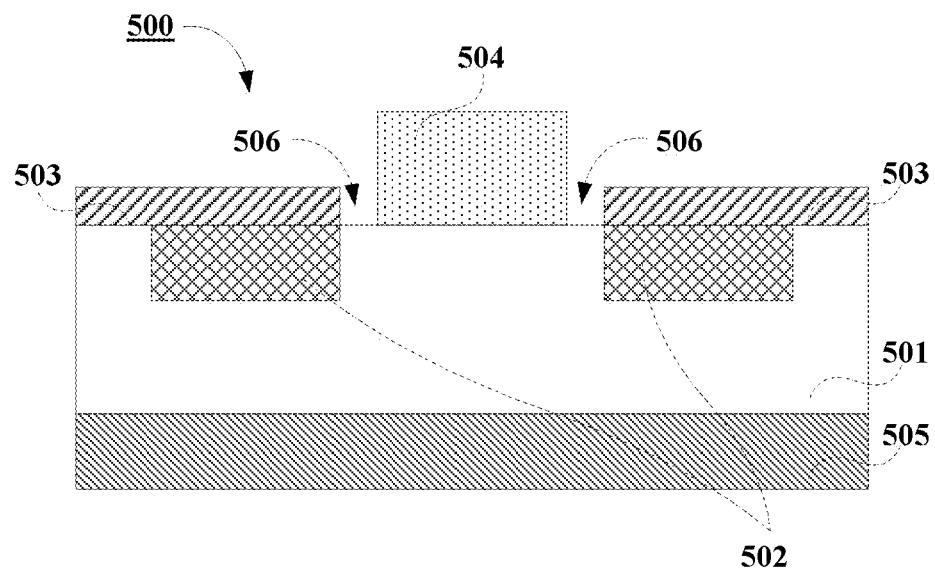
FIG. 5 is a diagram which shows a schematic illustration of a cross-section of a semiconductor device 500 in accordance with an embodiment of the present disclosure.

FIG. 5 is a diagram which shows a schematic illustration of a cross-section of a semiconductor device 500 in accordance with an embodiment of the present disclosure. As shown in FIG. 5, the semiconductor device 500 includes a N-type silicon carbide drift layer 501, a P-type buried silicon carbide layer 502 and a N-type oxide semiconductor layer 503.

As shown in FIG. 5, the P-type buried silicon carbide layer 502 is located within the N-type silicon carbide drift layer 501 and the P-type buried silicon carbide layer 502 is covered by the N-type oxide semiconductor layer 503.

As shown in FIG. 5, the semiconductor device 500 may further include an electrode 504 configured on the N-type silicon carbide drift layer 501. Alternatively, the semiconductor device 500 may further include a N-type silicon carbide substrate 505; the N-type silicon carbide drift layer 501 is configured on the N-type silicon carbide substrate 505.

As shown in FIG. 5, a gap 506 may be configured between the electrode 504 and the N-type oxide semiconductor layer 503. That is to say, the electrode 504 is not contacted with the N-type oxide semiconductor layer 503.

Therefore, there is a gap between the electrode 504 and the N-type oxide semiconductor layer 503; and the electrode 404 is insulated from the N-type oxide semiconductor layer 503, due to the gap 506. Breakdown may be avoided or decreased when a current is produced in the N-type oxide semiconductor layer 503; stability and/or long-time reliability of the semiconductor device may be further improved.

In an embodiment, the electrode may be contacted with the buried silicon carbide layer.

Figure 6:
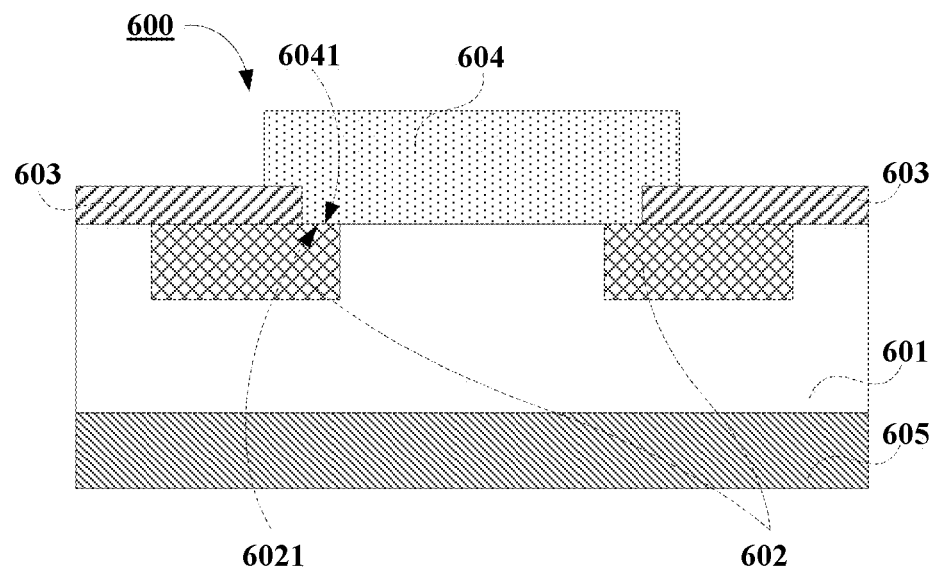
FIG. 6 is a diagram which shows a schematic illustration of a cross-section of a semiconductor device 600 in accordance with an embodiment of the present disclosure.

FIG. 6 is a diagram which shows a schematic illustration of a cross-section of a semiconductor device 600 in accordance with an embodiment of the present disclosure. As shown in FIG. 6, the semiconductor device 600 includes a N-type silicon carbide drift layer 601, a P-type buried silicon carbide layer 602 and a N-type oxide semiconductor layer 603.

As shown in FIG. 6, the P-type buried silicon carbide layer 602 is located within the N-type silicon carbide drift layer 601 and the P-type buried silicon carbide layer 602 is covered by the N-type oxide semiconductor layer 603.

As shown in FIG. 6, the semiconductor device 600 may further include an electrode 604 configured on the N-type silicon carbide drift layer 601. Alternatively, the semiconductor device 600 may further include a N-type silicon carbide substrate 605; the N-type silicon carbide drift layer 601 is configured on the N-type silicon carbide substrate 605.

As shown in FIG. 6, the electrode 604 is contacted with the P-type buried silicon carbide layer 602. For example, a part of the lower surface 6041 of the electrode 604 is directly connected with a part of the upper surface 6021 of the P-type buried silicon carbide layer 602.

Therefore, the electrode 604 may directly contact with the P-type buried silicon carbide layer 602; stability of the semiconductor device may be further improved since electric potential of the P-type buried silicon carbide layer 602 is stable. Furthermore, switching characteristics of the semiconductor device may be further improved. Moreover, long-time reliability of the semiconductor device may be further improved, due to a current path may be produced in some scenarios, such as a case of avalanche breakdown.

Figure 7:
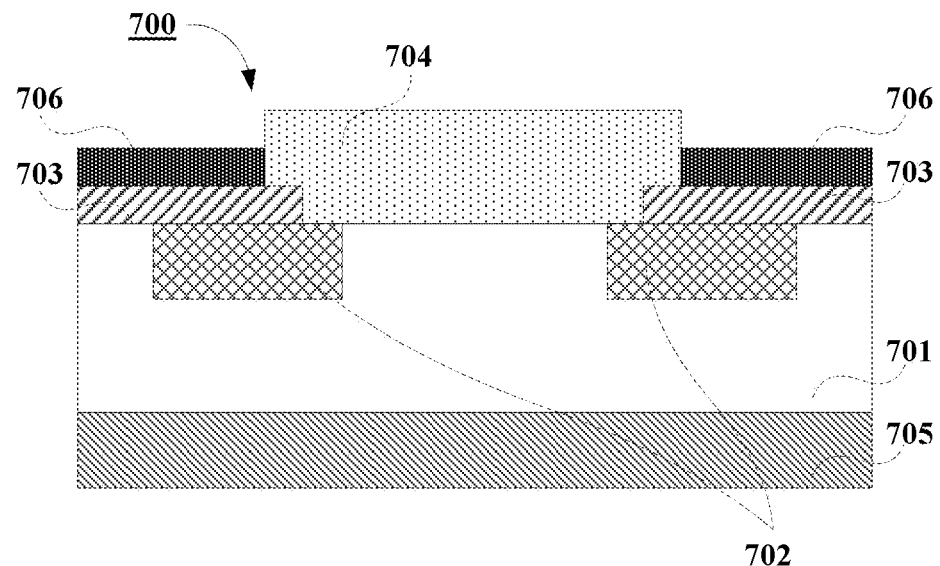
FIG. 7 is a diagram which shows a schematic illustration of a cross-section of a semiconductor device 700 in accordance with an embodiment of the present disclosure.

FIG. 7 is a diagram which shows a schematic illustration of a cross-section of a semiconductor device 700 in accordance with an embodiment of the present disclosure. As shown in FIG. 7, the semiconductor device 700 includes a N-type silicon carbide drift layer 701, a P-type buried silicon carbide layer 702 and a N-type oxide semiconductor layer 703.

As shown in FIG. 7, the P-type buried silicon carbide layer 702 is located within the N-type silicon carbide drift layer 701 and the P-type buried silicon carbide layer 702 is covered by the N-type oxide semiconductor layer 703.

As shown in FIG. 7, the semiconductor device 700 may further include an electrode 704 configured on the N-type silicon carbide drift layer 701. Alternatively, the semiconductor device 700 may further include a N-type silicon carbide substrate 705; the N-type silicon carbide drift layer 701 is configured on the N-type silicon carbide substrate 705.

As shown in FIG. 7, the semiconductor device 700 may further include a protective layer 706 configured on the N-type oxide semiconductor layer 703. Furthermore, the electrode 704 is contacted with the P-type buried silicon carbide layer 702.

Therefore, the electrode 704 may directly connect with the P-type buried silicon carbide layer 702; stability of the semiconductor device may be further improved since electric potential of the P-type buried silicon carbide layer 702 is stable. Furthermore, switching characteristics of the semiconductor device may be further improved. Furthermore, long-time reliability of the semiconductor device may be further improved, due to a current path may be produced in some scenarios, such as a case of avalanche breakdown.

Figure 8:
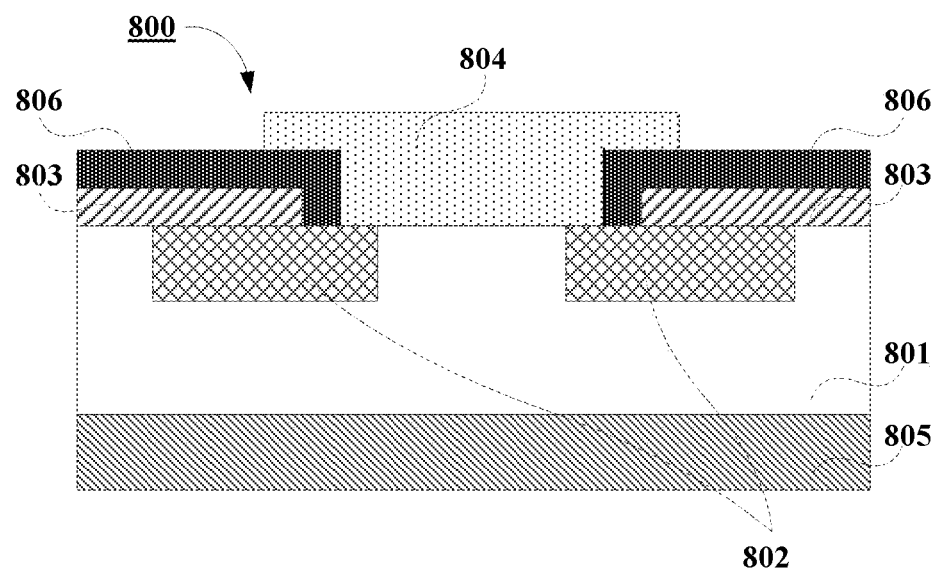
FIG. 8 is a diagram which shows a schematic illustration of a cross-section of a semiconductor device 800 in accordance with an embodiment of the present disclosure.

FIG. 8 is another diagram which shows a schematic illustration of a cross-section of a semiconductor device 800 in accordance with an embodiment of the present disclosure. As shown in FIG. 8, the semiconductor device 800 includes a N-type silicon carbide drift layer 801, a P-type buried silicon carbide layer 802 and a N-type oxide semiconductor layer 803.

As shown in FIG. 8, the P-type buried silicon carbide layer 802 is located within the N-type silicon carbide drift layer 801 and the P-type buried silicon carbide layer 802 is covered by the N-type oxide semiconductor layer 803.

As shown in FIG. 8, the semiconductor device 800 may further include an electrode 804 configured on the N-type silicon carbide drift layer 801. Alternatively, the semiconductor device 800 may further include a N-type silicon carbide substrate 805; the N-type silicon carbide drift layer 801 is configured on the N-type silicon carbide substrate 805.

As shown in FIG. 8, the semiconductor device 800 may further include a protective layer 806 configured on the N-type oxide semiconductor layer 803. Furthermore, the protective layer 806 is configured between the electrode 804 and the N-type oxide semiconductor layer 803. Moreover, the electrode 804 is contacted with the P-type buried silicon carbide layer 802.

Therefore, the electrode 804 may directly connect with the P-type buried silicon carbide layer 802; stability of the semiconductor device may be further improved since electric potential of the P-type buried silicon carbide layer 802 is stable. Furthermore, switching characteristics of the semiconductor device may be further improved. Furthermore, long-time reliability of the semiconductor device may be further improved, due to a current path may be produced in some scenarios, such as a case of avalanche breakdown.

Figure 9:
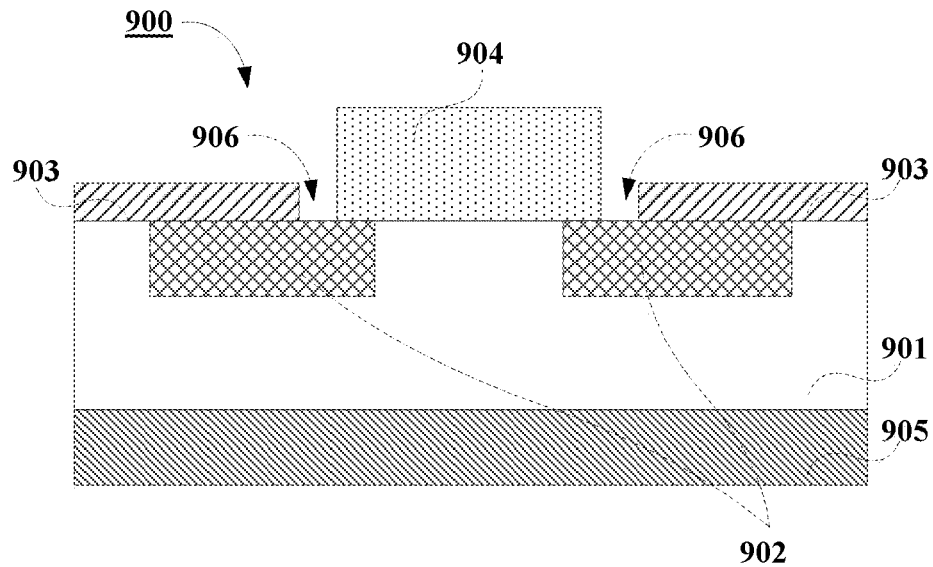
FIG. 9 is a diagram which shows a schematic illustration of a cross-section of a semiconductor device 900 in accordance with an embodiment of the present disclosure.

FIG. 9 is another diagram which shows a schematic illustration of a cross-section of a semiconductor device 900 in accordance with an embodiment of the present disclosure. As shown in FIG. 9, the semiconductor device 900 includes a N-type silicon carbide drift layer 901, a P-type buried silicon carbide layer 902 and a N-type oxide semiconductor layer 903.

As shown in FIG. 9, the P-type buried silicon carbide layer 902 is located within the N-type silicon carbide drift layer 901 and the P-type buried silicon carbide layer 902 is covered by the N-type oxide semiconductor layer 903.

As shown in FIG. 9, the semiconductor device 900 may further include an electrode 904 configured on the N-type silicon carbide drift layer 901. Alternatively, the semiconductor device 900 may further include a N-type silicon carbide substrate 905; the N-type silicon carbide drift layer 901 is configured on the N-type silicon carbide substrate 905.

As shown in FIG. 9, a gap 906 may be configured between the electrode 904 and the N-type oxide semiconductor layer 903. That is to say, the electrode 904 is not contacted with the N-type oxide semiconductor layer 903. Moreover, the electrode 904 is contacted with the P-type buried silicon carbide layer 902.

Therefore, the electrode 904 may directly connect with the P-type buried silicon carbide layer 902; stability of the semiconductor device may be further improved since electric potential of the P-type buried silicon carbide layer 902 is stable. Furthermore, switching characteristics of the semiconductor device may be further improved. Furthermore, long-time reliability of the semiconductor device may be further improved, due to a current path may be produced in some scenarios, such as a case of avalanche breakdown.

It is to be understood that, the above examples or embodiments are discussed for illustration, rather than limitation. Those skilled in the art would appreciate that there may be many other embodiments or examples within the scope of the present disclosure.

As can be seen from the above embodiments, a buried silicon carbide layer is located within a silicon carbide drift layer and the buried silicon carbide layer is covered by an oxide semiconductor layer. Therefore, a band gap of the oxide semiconductor layer is large and breakdown behavior and/or long-time reliability of the semiconductor device may be further improved.

A Second Aspect of Embodiments

A method for manufacturing a semiconductor device is provided in these embodiments. The semiconductor device is illustrated in the first aspect of embodiments, and the same contents as those in the first aspect of embodiments are omitted.

Figure 10:
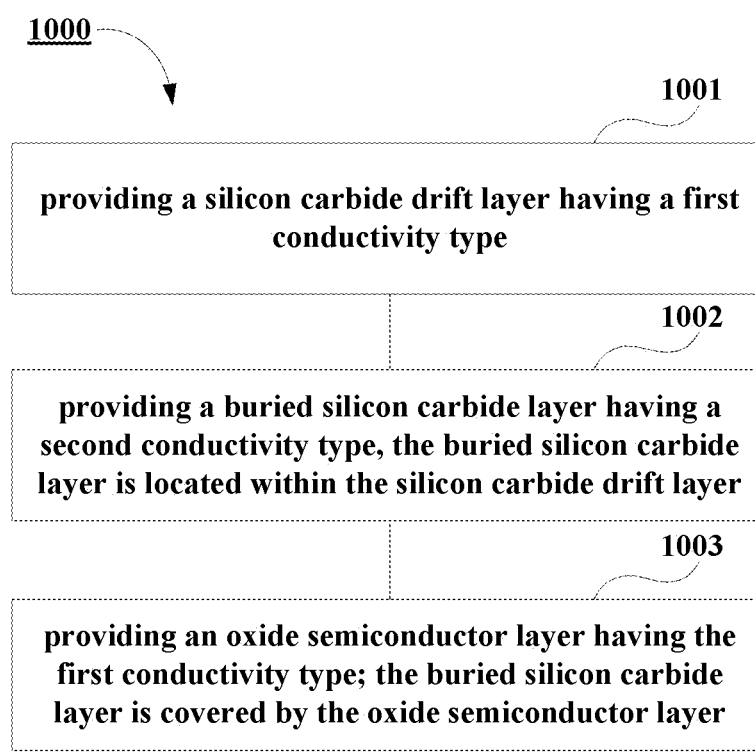
FIG. 10 is a diagram which shows a method for manufacturing a semiconductor device in accordance with an embodiment of the present disclosure.

FIG. 10 is a diagram which shows a method for manufacturing a semiconductor device in accordance with an embodiment of the present disclosure. As shown in FIG. 10, the method 1000 includes:

Block 1001, providing a silicon carbide drift layer having a first conductivity type;

Block 1002, providing a buried silicon carbide layer having a second conductivity type, the buried silicon carbide layer is located within the silicon carbide drift layer; and Block 1003, providing an oxide semiconductor layer having the first conductivity type; the buried silicon carbide layer is covered by the oxide semiconductor layer.

In an embodiment, a sputtering method and/or a chemical vapor deposition (CVD) method may be used to provide the layers. However, it is not limited thereto, other methods or solutions may be adopted according to actual scenarios.

In an embodiment, the first conductivity type may be an n-doping (or may be referred to as N-type, e.g., caused by incorporating nitrogen ions, phosphor ions or arsenic ions during an epitaxy process) and the second conductivity type may be a p-doping (or may be referred to as P-type, e.g., caused by incorporating aluminum ions or boron ions during an epitaxy process). However, it is not limited thereto in this disclosure.

Figure 11:
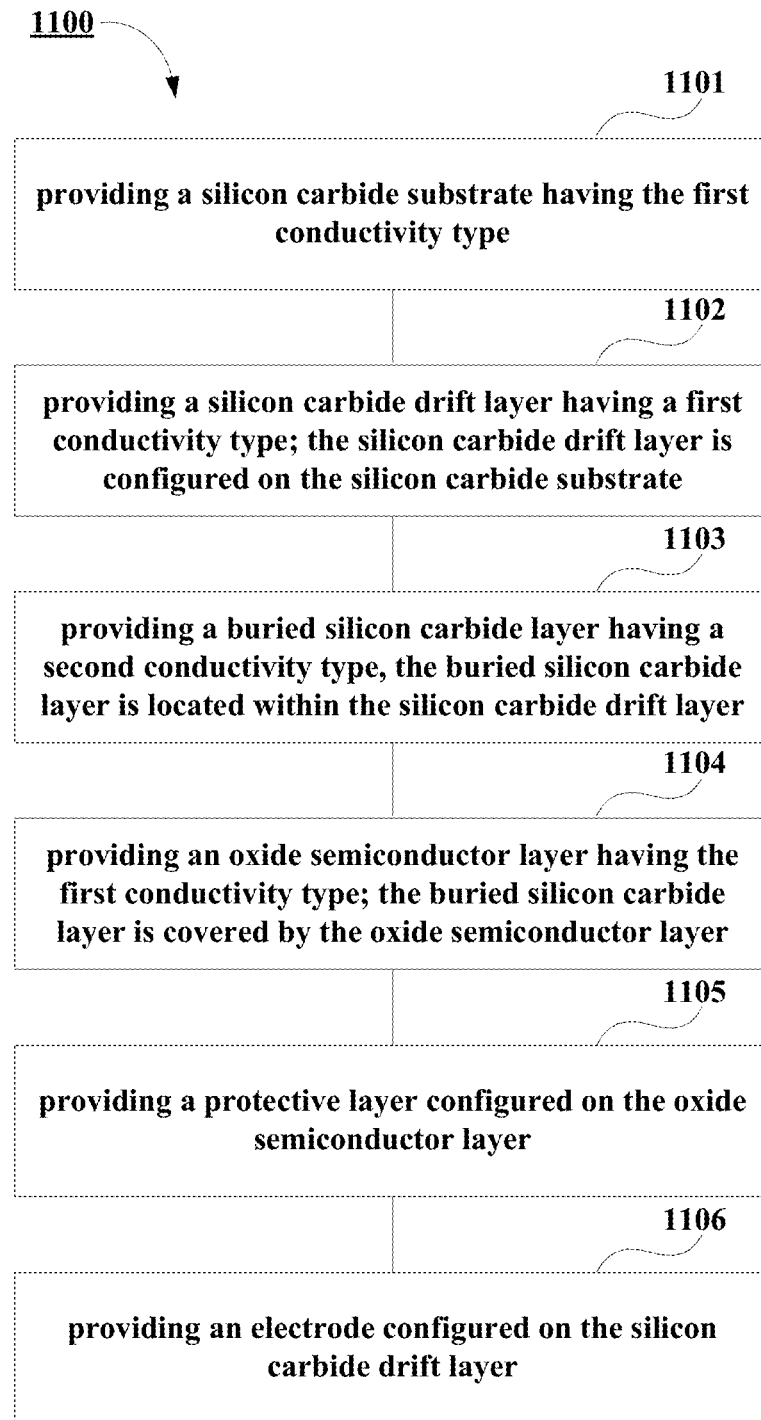
FIG. 11 is another diagram which shows a method for manufacturing a semiconductor device in accordance with an embodiment of the present disclosure.

FIG. 11 is another diagram which shows a method for manufacturing a semiconductor device in accordance with an embodiment of the present disclosure. As shown in FIG. 11, the method 1100 includes:

Block 1101, providing a silicon carbide substrate having the first conductivity type.

Block 1102, providing a silicon carbide drift layer having a first conductivity type;

and the silicon carbide drift layer is configured on the silicon carbide substrate.

Block 1103, providing a buried silicon carbide layer having a second conductivity type; and the buried silicon carbide layer is located within the silicon carbide drift layer.

Block 1104, providing an oxide semiconductor layer having the first conductivity type; and the buried silicon carbide layer is covered by the oxide semiconductor layer.

Block 1105, providing a protective layer configured on the oxide semiconductor layer.

Block 1106, providing an electrode configured on the silicon carbide drift layer.

It should be appreciated that FIG. 10 or FIG. 11 is only an example of the disclosure, but it is not limited thereto. For example, the order of operations at blocks may be adjusted and/or some blocks may be omitted. Moreover, some blocks not shown in FIG. 10 or FIG. 11 may be added.

As can be seen from the above embodiments, a buried silicon carbide layer is located within a silicon carbide drift layer and the buried silicon carbide layer is covered by an oxide semiconductor layer. Therefore, a band gap of the oxide semiconductor layer is large and breakdown behavior and/or long-time reliability of the semiconductor device may be further improved.

Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device.

While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous.

Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A semiconductor device, comprising:
   a silicon carbide drift layer having a first conductivity type;
   a buried silicon carbide layer having a second conductivity type, the buried silicon carbide layer is located within the silicon carbide drift layer;
   an oxide semiconductor layer having the first conductivity type; wherein the buried silicon carbide layer is covered by the oxide semiconductor layer; and
   a protective layer configured on the oxide semiconductor layer.

2. The semiconductor device according to the claim 1, wherein a band gap of the oxide semiconductor layer is larger than a band gap of a silicon carbide layer.

3. The semiconductor device according to the claim 1, wherein the oxide semiconductor layer comprising zinc oxide and/or stannic oxide.

4. The semiconductor device according to the claim 1, wherein the first conductivity type is an n-doping and the second conductivity type is a p-doping.

5. The semiconductor device according to the claim 1, wherein a first surface of the oxide semiconductor layer is contacted with the protective layer and a second surface of the oxide semiconductor layer is contacted with the buried silicon carbide layer.

6. The semiconductor device according to the claim 1, wherein the protective layer comprising silicon oxide and/or silicon nitride and/or silicon oxide nitride.

7. The semiconductor device according to the claim 1, wherein the semiconductor device further comprising:
   a silicon carbide substrate having the first conductivity type; wherein the silicon carbide drift layer is configured on the silicon carbide substrate.

8. The semiconductor device according to the claim 1, wherein the semiconductor device further comprising:
   an electrode configured on the silicon carbide drift layer.

9. The semiconductor device according to the claim 8, wherein the electrode is not contacted with the oxide semiconductor layer.

10. The semiconductor device according to the claim 9, wherein the protective layer is configured between the electrode and the oxide semiconductor layer.

11. The semiconductor device according to the claim 9, wherein a gap is configured between the electrode and the oxide semiconductor layer.

12. The semiconductor device according to the claim 8, wherein the electrode is contacted with the buried silicon carbide layer.

13. The semiconductor device according to the claim 12, wherein a gap is configured between the electrode and the oxide semiconductor layer.

14. The semiconductor device according to the claim 12, wherein the protective layer is configured between the electrode and the oxide semiconductor layer.

15. The semiconductor device according to the claim 14, wherein the protective layer is covered on the oxide semiconductor layer.

16. A method for manufacturing a semiconductor device, comprising:
   providing a silicon carbide drift layer having a first conductivity type;
   providing a buried silicon carbide layer having a second conductivity type, the buried silicon carbide layer is located within the silicon carbide drift layer;
   providing an oxide semiconductor layer having the first conductivity type; wherein the buried silicon carbide layer is covered by the oxide semiconductor layer; and
   providing a protective layer configured on the oxide semiconductor layer.

17. The method according to the claim 16, wherein the method further comprising:
   providing an electrode configured on the silicon carbide drift layer.

18. The method according to the claim 16, wherein the method further comprising:
   providing a silicon carbide substrate having the first conductivity type; wherein the silicon carbide drift layer is configured on the silicon carbide substrate.

* * * * *